United States Patent
Sears et al.

(10) Patent No.: US 11,302,510 B2
(45) Date of Patent: Apr. 12, 2022

(54) SPACE CHARGE INSENSITIVE ELECTRON GUN DESIGNS

(71) Applicant: KLA-TENCOR CORPORATION, Milpitas, CA (US)

(72) Inventors: Christopher Sears, Fremont, CA (US); Luca Grella, Gilroy, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 762 days.

(21) Appl. No.: 16/100,812

(22) Filed: Aug. 10, 2018

(65) Prior Publication Data
US 2019/0371564 A1    Dec. 5, 2019

Related U.S. Application Data

(60) Provisional application No. 62/677,616, filed on May 29, 2018.

(51) Int. Cl.
| | |
|---|---|
| *H01J 37/063* | (2006.01) |
| *H01J 37/073* | (2006.01) |
| *H01J 37/24* | (2006.01) |
| *H01J 37/28* | (2006.01) |
| *H01J 37/065* | (2006.01) |

(52) U.S. Cl.
CPC .......... *H01J 37/065* (2013.01); *H01J 37/073* (2013.01); *H01J 37/241* (2013.01); *H01J 37/28* (2013.01); *H01J 2237/06375* (2013.01)

(58) Field of Classification Search
CPC ..... H01J 2237/06375; H01J 2237/1538; H01J 37/073; H01J 37/063; H01J 37/28; H01J 3/029; H01J 2237/065; H01J 37/065; H01J 3/027; H01J 37/241; H01J 3/12
See application file for complete search history.

(56) References Cited

U.S. PATENT DOCUMENTS

| | | | |
|---|---|---|---|
| 6,525,480 B1* | 2/2003 | Hargus, Jr | F03H 1/0068 250/423 R |
| 7,960,697 B2 | 6/2011 | Chen et al. | |
| 9,934,933 B1 | 4/2018 | Hordon et al. | |
| 2003/0001496 A1* | 1/2003 | Kinoshita | H01J 31/501 313/529 |
| 2014/0035458 A1* | 2/2014 | Wu | H01J 37/3233 315/5.35 |

FOREIGN PATENT DOCUMENTS

| | | |
|---|---|---|
| EP | 1253618 B1 | 7/2008 |
| JP | 2005044720 A | 2/2005 |

OTHER PUBLICATIONS

WIPO, ISR for PCT/US2019/034084, dated Sep. 20, 2019.

\* cited by examiner

*Primary Examiner* — Dana Ross
*Assistant Examiner* — Kuangyue Chen
(74) *Attorney, Agent, or Firm* — Hodgson Russ LLP

(57) ABSTRACT

Electron gun systems with a particular inner width dimension, sweep electrodes, or a combination of a particular inner width dimension and sweep electrodes are disclosed. The inner width dimension may be less than twice a value of a Larmor radius of secondary electrons in a channel downstream of a beam limiting aperture, and a Larmor time for the secondary electrons may be greater than 1 ns. The sweep electrode can generates an electric field in a drift region, which can increase kinetic energy of secondary electrons in the channel.

16 Claims, 11 Drawing Sheets

SPACE CHARGE INSENSITIVE ELECTRON GUN DESIGNS

CROSS-REFERENCE TO RELATED APPLICATIONS

This application claims priority to the provisional patent application filed May 29, 2018 and assigned U.S. App. No. 62/677,616, the disclosure of which is hereby incorporated by reference.

FIELD OF THE DISCLOSURE

This disclosure relates to electron gun systems.

BACKGROUND OF THE DISCLOSURE

Evolution of the semiconductor manufacturing industry is placing ever greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

High-voltage electron guns are known in various fields. For example, electron guns can be used as a source of electrons in electron beam lithography (e.g., for fabrication of semiconductor masks). Electron guns also can be used in scanning electron microscopes, electron beam testing of integrated circuits, and line width metrology measuring equipment used in the semiconductor industry. Such electron guns also have application outside of the semiconductor industry, such as in scanning electron microscopes.

For example, FIG. 1 shows dimensioning of the beam drift region of an electron gun. The electron gun system 100 includes an electron source 101 that directs a primary beam of electrons 102. A plate 103 defines a beam limiting aperture 111. The primary beam of electrons 102 is projected through the beam limiting aperture 111. The channel 105 next to the plate 103 has an inner width dimension 106. The secondary electrons 104 interfere with electrons from the primary beam of electrons 102.

Therefore, improved electron gun designs are needed.

BRIEF SUMMARY OF THE DISCLOSURE

An electron gun system is provided in a first embodiment. The electron gun system comprises an electron source that directs a primary beam of electrons, a plate defining a beam limiting aperture, a magnetic field source that generates a magnetic field, a voltage source connected to the magnetic field source, and a channel that the primary beam of electrons is projected through after being projected through the beam limiting aperture. The primary beam of electrons is projected through the beam limiting aperture. The channel has an inner width dimension perpendicular to a direction the primary beam of electrons is projected. The inner width dimension is less than or equal to twice a value of a Larmor radius of secondary electrons in the channel. A Larmor time for the secondary electrons is greater than 1 ns. The inner width dimension may be a diameter.

The inner width dimension may be from 2 mm to 5 mm. In an instance, the inner width dimension is from 2 mm to 3 mm.

The electron gun system can further include a sweep electrode that generates an electric field in a drift region. The electric field increases kinetic energy of secondary electrons in the channel. In an instance, the electron gun system further includes a second voltage source connected to the sweep electrode. The sweep electrode may be positioned 6 mm downstream of the beam limiting aperture with respect to the direction the primary beam of electrons is projected. The sweep electrode may operate at a voltage from −100 V to +100 V.

An electron gun system is provided in a second embodiment. The electron gun system comprises an electron source that directs a primary beam of electrons, a plate defining a beam limiting aperture, a magnetic field source that generates a magnetic field, a channel that the primary beam of electrons is projected through after being projected through the beam limiting aperture, a sweep electrode that generates an electric field in a drift region. The primary beam of electrons is projected through the beam limiting aperture. The electric field increases kinetic energy of secondary electrons in the channel.

The electron gun system can further include a voltage source connected to the sweep electrode.

The sweep electrode may be positioned 6 mm downstream of the beam limiting aperture with respect to the direction the primary beam of electrons is projected.

The sweep electrode may operate at a voltage from −100 V to +100 V.

A method is provided in a third embodiment. The method comprises generating a primary beam of electrons with an electron source. The primary beam of electrons is projected through a beam limiting aperture. The primary beam of electrons is then projected through a channel downstream of the beam limiting aperture. The secondary electrons in the channel are limited to one orbit or less. The secondary electrons in the channel have a Larmor radius and a Larmor time. The channel has an inner width dimension perpendicular to a direction the primary beam of electrons is projected. The inner width dimension is less than or equal to twice a value of the Larmor radius. The Larmor time for the secondary electrons is greater than 1 ns. The inner width dimension may be a diameter.

The inner width dimension may be from 2 mm to 5 mm. In an instance, the inner width dimension is from 2 mm to 3 mm.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Optical performance of an electron gun can be improved by adjusting a Larmor radius and/or using magnetic fields. This can be accomplished by adjusting dimensions of the drift region or by adding additional magnetic fields, which can reduce the number of orbits by secondary electrons.

Figure 1:
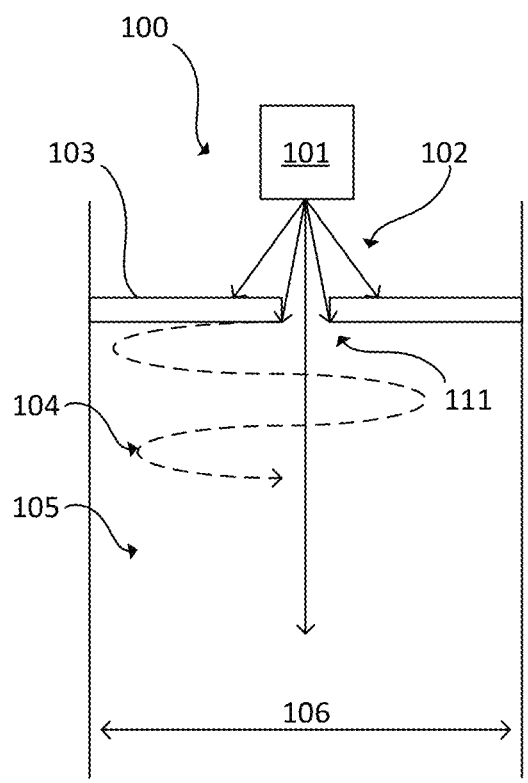
FIG. 1 is a block diagram that shows dimensioning of the beam drift region in a previous system.

FIG. 1 is a block diagram that shows dimensioning the beam drift region to take advantage of the Larmor radius. Dimensioning the beam drift region after the beam limiting aperture can reduce the residency time of secondary electrons emitted at the beam limiting aperture. By reducing residency time, there may be less interaction between the secondary electrodes and the primary beam of electrons. This reduces the negative effects caused by the secondary electrodes.

The electron gun system 107 includes an electron source 101 that directs a primary beam of electrons 102. A plate 103 defines a beam limiting aperture 111. The primary beam of electrons 102 is projected through the beam limiting aperture 111. The channel 105 next to the plate 103 has an inner width dimension 110. The channel 105 is downstream of the plate 103 with the beam limiting aperture 111 with respect to a path of the primary beam of electrons 102.

A magnetic field source 108 generates a magnetic field in the channel 105. A voltage source 109 is in electronic communication with the magnetic field source 108. An immersive magnetic field can be used to improve the optical performances (e.g., brightness and spot size) of the electron gun system 107. For example, the residual magnetic field strength in the drift region is around 100 Gauss.

The primary beam of electrons 102 is projected through the channel 105, which may be in the beam drift region of the electron gun system 107. The beam current in the primary beam of electrons 102 is formed by a beam limiting aperture 111 that blocks part of the primary beam of electrons 102. The resulting electron scattering at the beam limiting aperture 111 generates randomly distributed low energy secondary electrons 104 confined around the primary beam of electrons 102 by the residual magnetic field present at the beam limiting aperture 111. The confinement of the generated secondary electrons 104 is characterized by the Larmor radius and their residency time (i.e., time to complete one orbit multiplied by the number of orbits). If the residency time of the secondary electrons 104 is larger than the transit time of the primary beam of electrons 102, the resulting randomly-changing charge distribution can degrade the resolution and brightness of the electron gun system 107. The mechanism of the performance degradation is a random beam deflection and a random shift of the image plane. This effect takes place in the drift region of the electron beam column, where the electric field is zero and the magnetic field may still be significant (e.g., 100 Gauss).

A Larmor radius is the radius of the circle along which a charged particle, such as an electron, moves in the presence of a uniform magnetic field. The magnetic moment of the system can manifest as a result of the rotation of the charged particle in the magnetic field. The Larmor time is the time required to complete one orbit.

The channel 105 has an inner width dimension 110 perpendicular to a direction that the primary beam of electrons 102 is projected. The inner width dimension 110, which may be a diameter or other width, is less than or equal to twice a value of a Larmor radius of secondary electrons 104 in the channel 105. Compared to the design of FIG. 1, the inner width dimension 110 is less than the inner width dimension 106.

Figure 3:
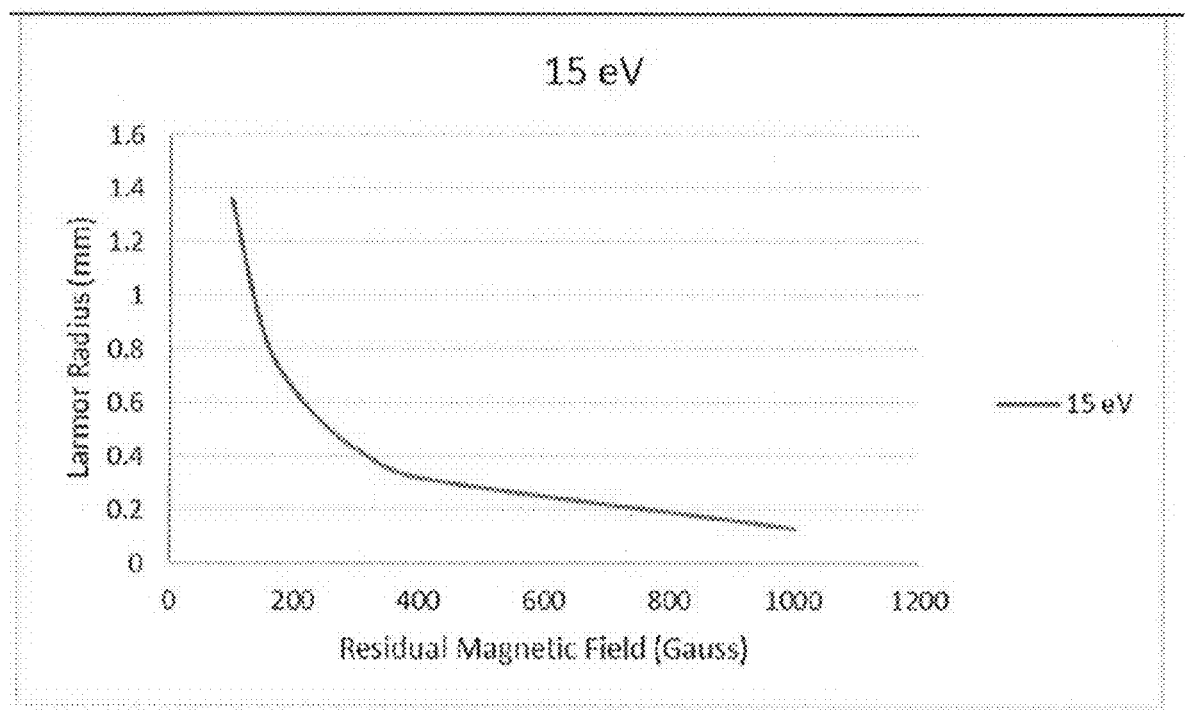
FIG. 3 illustrates Larmor radius of 15 eV electrons versus residual magnetic field in drift space.
Figure 4:
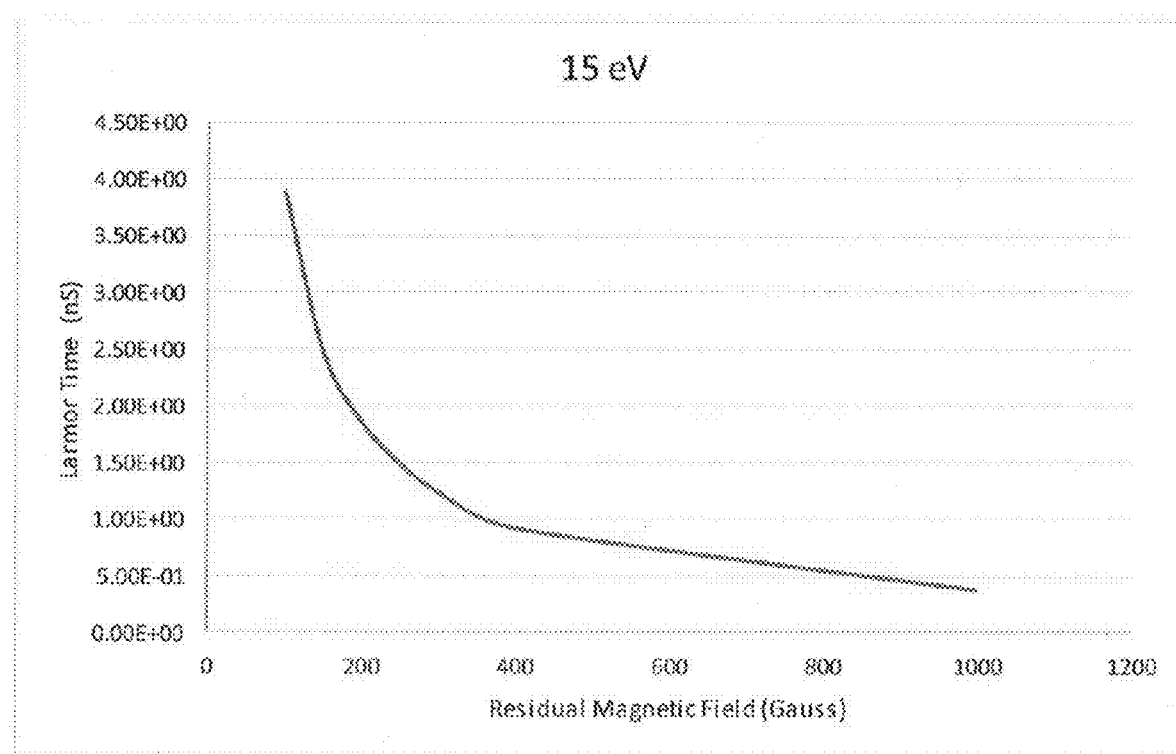
FIG. 4 illustrates time to complete one orbit (Larmor time) versus residual magnetic field for 15 eV electrons.

The brightness degradation can be reduced by an adjusting the inner width dimension 110 of the drift space where the residency time is maintained comparable to the transit time. Each secondary electron 104 may be allowed only one or less orbits (e.g., less than or equal to a 360° orbit around a starting point). The inner width dimension 110 of the drift space in the channel 105 is related to the width of the Larmor radius of 15 eV electrons (average energy of secondary electron emission). FIG. 3 illustrates Larmor radius of 15 eV electrons versus residual magnetic field in drift space. In the 100 Gauss residual magnetic field case, the Larmor radius is about 1.5 mm. Therefore, a drift space with 3 mm diameter can force the secondary electrons 104 to one or less orbits, making the Larmor time equal or less than the residency time (number of orbits<~1). FIG. 4 illustrates time to complete one orbit (Larmor time) versus residual magnetic field for 15 eV electron. FIG. 4 shows that such time is about 3.5 ns which is comparable to typical 1 ns transit times of a high energy beam (30 keV). No degradation of brightness and resolution is expected under these conditions.

A Larmor time for the secondary electrons 104 may be greater than 1 ns. A time for orbit of the secondary electrons 104 of less than 1 ns may prevent an effect on the primary beam of electrons 102.

The Larmor radius and the Larmor time may be dependent on the magnetic field of the magnetic field source 108. For example, a larger magnetic field can result in a smaller Larmor radius and a smaller Larmor time.

The inner width dimension 110 may depend on the radius of the secondary electrons 104 for a given magnetic field. For example, the inner width dimension 110 may be from 0.2 mm to 5 mm, including all values to the 0.01 mm and ranges between. In an instance, the inner width dimension 110 is from approximately 2 mm to approximately 5 mm, including all ranges and values to the 0.1 mm between. In a particular example, wherein the inner width dimension 110 is 2 mm to 3 mm. The higher the residual magnetic field, then the narrower the drift region may need to be. These inner width dimensions 110 provide the Larmor radius benefits and the improved results disclosed herein.

Figure 11:
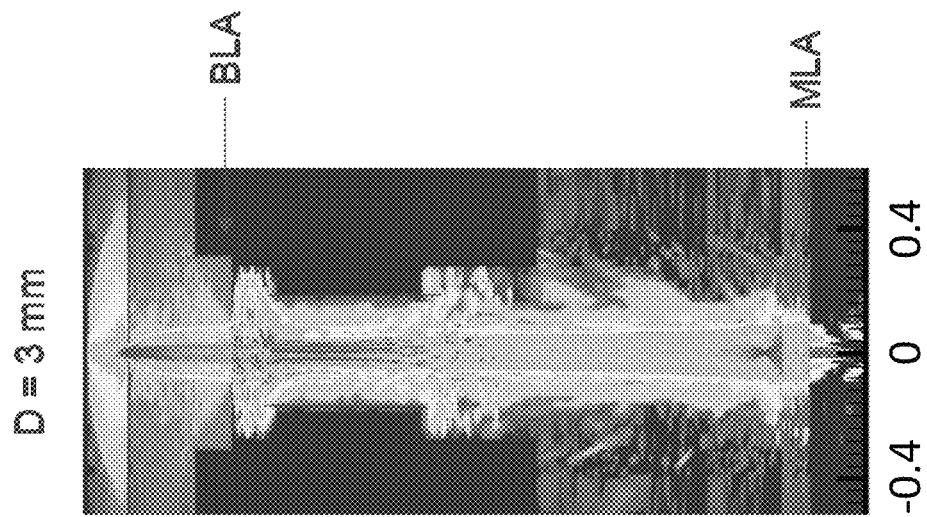
FIGS. 9-11 show the effect of changing inner width dimension on space charge blur.
Figure 10:
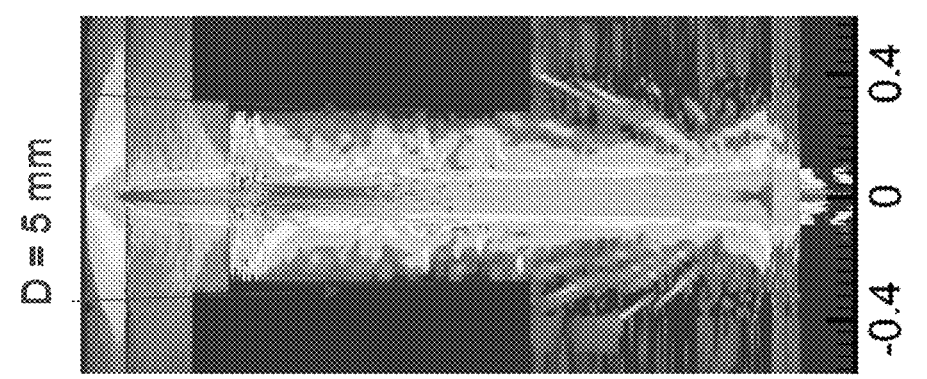
Figure 9:
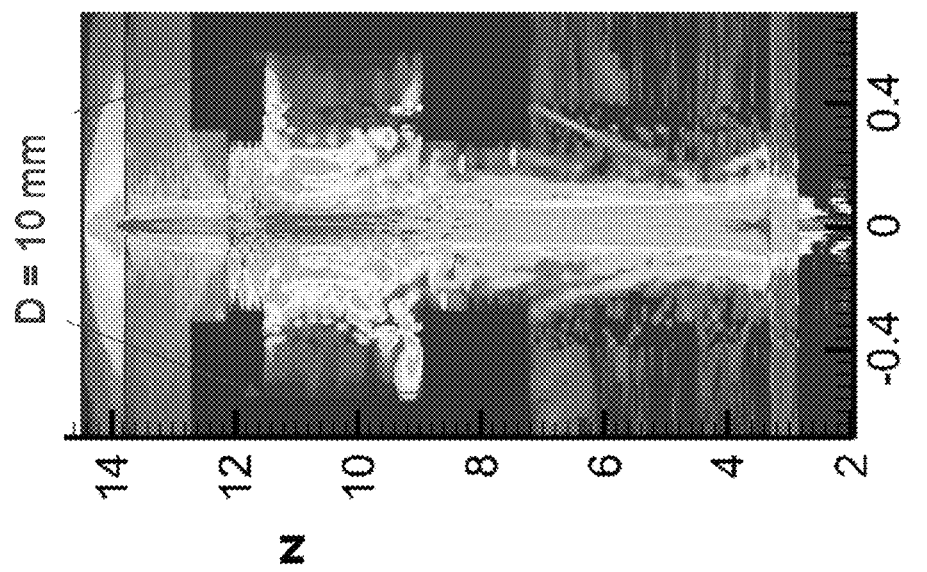

FIGS. 9-11 show the effect of changing inner width dimension 110 on space charge blur. In FIGS. 9-11, a distance between the beam limiting aperture and a gate valve is 10 mm. FIG. 9 shows an inner width dimension of 10 mm. FIG. 9 includes random deflection of 80 nm. FIG. 10 shows an inner width dimension of 5 mm. FIG. 10 includes random deflection of 20 nm. FIG. 11 shows an inner width dimension of 3 mm. FIG. 11 includes a deflection of 15 nm. Therefore, a narrower inner width dimension can improve beam quality due to the effect on space charge formed by secondary electrons.

In an instance, only magnetic fields that cause a Larmor time of greater than 1 ns may be associated with the design and inner width dimension 110 configuration as disclosed herein. The Larmor time of the secondary electrons may need to be smaller than the transit time of the primary beam in the drift region. Otherwise, the secondary electrons 104 may not significantly affect the primary beam of electrons 102. Thus, the inner width dimension 110 may not be configured as disclosed herein for magnetic fields of greater than approximately 400 Gauss.

Figure 5:
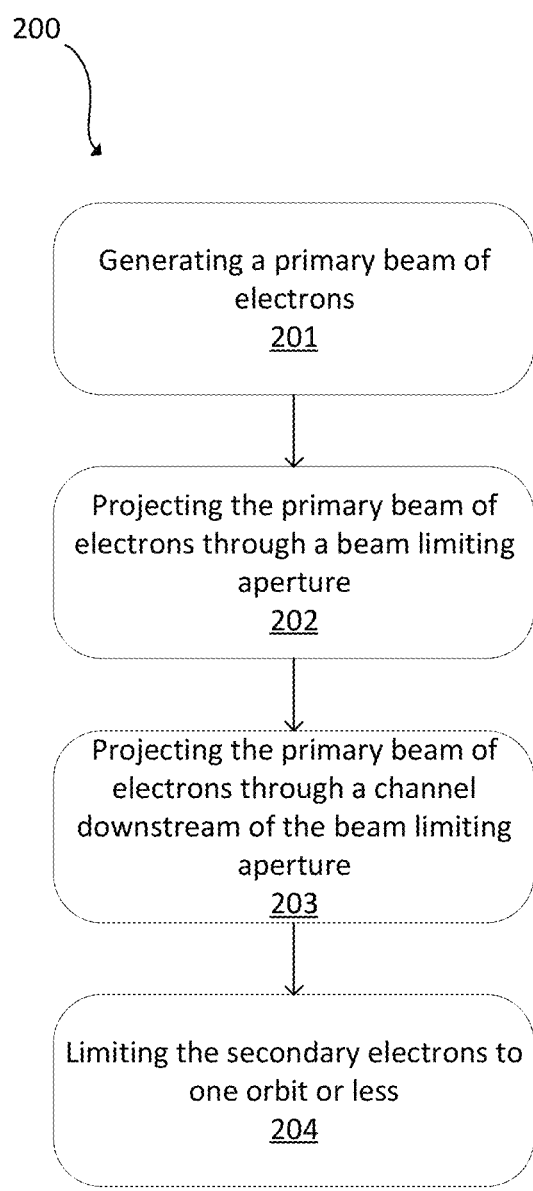
FIG. 5 is a flowchart of an embodiment of a method in accordance with the present disclosure

FIG. 5 is a flowchart of an embodiment of a method 200. At 201, a primary beam of electrons is generated with an electron source. The primary beam of electrons is projected through a beam limiting aperture at 202. The primary beam of electrons is projected through a channel downstream of the beam limiting aperture at 203. The channel has an inner width dimension perpendicular to a direction the primary beam of electrons is projected. Secondary electrons in the channel have a Larmor radius and a Larmor time. The inner width dimension (e.g., a diameter) is less or equal to than twice a value of the Larmor radius, and the Larmor time for the secondary electrons is greater than 1 ns. The secondary electrons in the channel are limited to one orbit or less at 204. The Larmor radius and the Larmor time may be dependent on the magnetic field of the magnetic field source.

Figure 6:
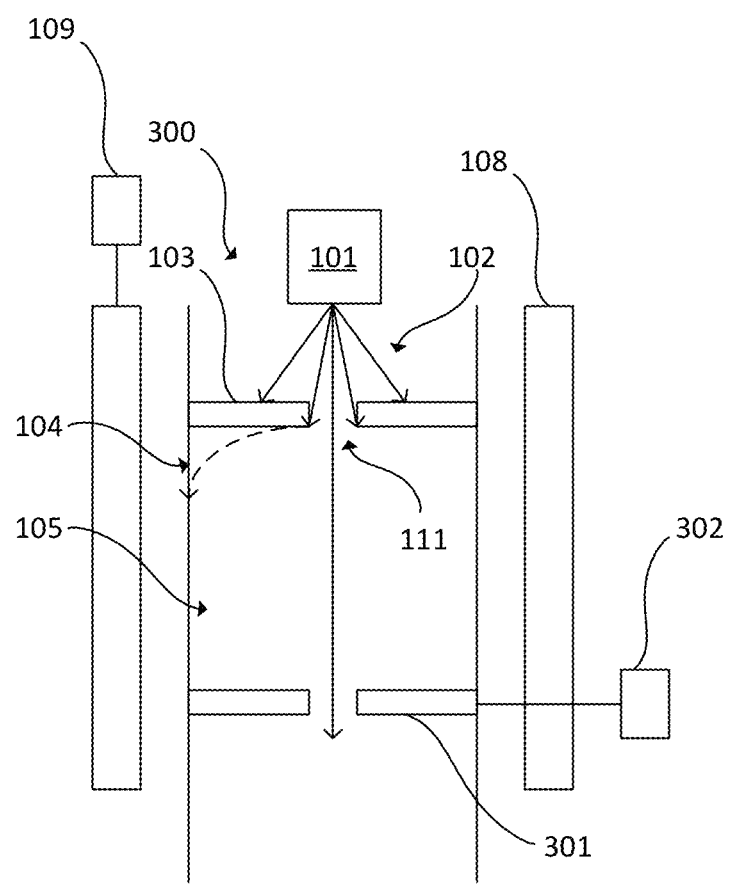
FIG. 6 is a block diagram of an embodiment with a sweep electrode.

FIG. 6 is a block diagram of an embodiment of an electron gun system 300 with a sweep electrode 301. The electron gun system 300 of FIG. 6 may include some of the same components as the electron gun system 107 of FIG. 2. The primary beam of electrons 102 is projected through the channel 105 after being projected through the beam limiting aperture 111 in the plate 103. The sweep electrode 301 generates an electric field in a drift region of the channel 105. The electric field increases kinetic energy of secondary electrons 104 in the channel 105. A voltage source 302 may be in electronic communication with the sweep electrode 301. The sweep electrode 301 may be a biased plate with an aperture that the primary beam of electrons 102 passes through. The sweep electrode 301 also may be one or more electrodes disposed in the channel 105.

The sweep electrode 301 can reduce or prevent bunching of secondary electrons 104 in the drift region. The field generated by the sweep electrode 301 can remove the secondary electrons 301. In an instance, the field generated by the sweep electrode 301 can act as a slope to sweep the secondary electrons 301 away from the primary beam of electrons 102.

The sweep electrode 301 may be positioned in the middle of the drift region or field-free region. In an example, the sweep electrode 301 is positioned 6 mm downstream of the plate with the beam limiting aperture with respect to the direction the primary beam of electrons 102 is projected. However, the exact position of the sweep electrode 301 can vary.

The sweep electrode 301 may generate a voltage of −100 V to +100 V. This may not be strong enough to affect the primary beam, but can affect secondary electrons 104.

The voltage applied to the sweep electrode 301 may be configured to reduce or prevent aberrations in the primary beam of electrons 102.

Figures 7, 8:
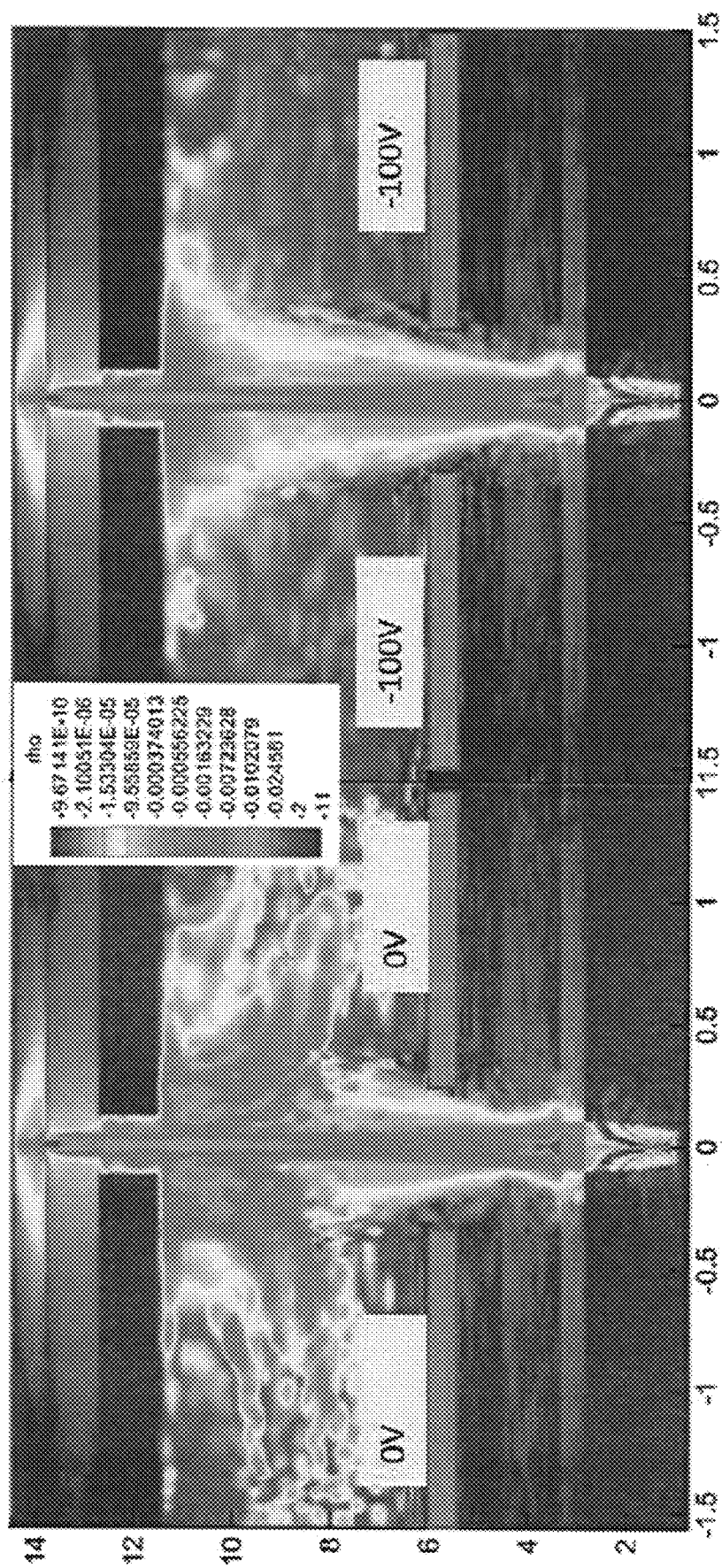
FIG. 7 is space charge density in the beam limiting aperture region without an electric field.
FIG. 8 is space charge density with a 20 V/cm electric field

The space charge statistical effects on brightness and resolution in the electron gun system 300 can be reduced by introducing a small electric field in the drift region of the channel 105 to increase kinetic energy of the secondary electrons 104 (e.g., slow electron sweep electrode) and therefore reduce residency time of the secondary electrons 105. FIG. 7 shows an instantaneous space charge distribution (or statistical sample) in the drift region without a sweep electrode (left) and with a sweep electrode (right). It can be seen that such space charge density has bigger extent and intensity in the field free case.

FIG. 7 is space charge density in the beam limiting aperture region without an electric field and FIG. 8 is space charge density with a 20 V/cm electric field. The units in FIGS. 7-8 are cm and esu/cmA$^3$.

FIG. 8 has the sweep electrode at −100 V. This introduces a field of only 20 V/cm and decreases the effect of statistical space charge on optical performances. No negative effect on brightness and resolution is expected in this case.

Figure 12:
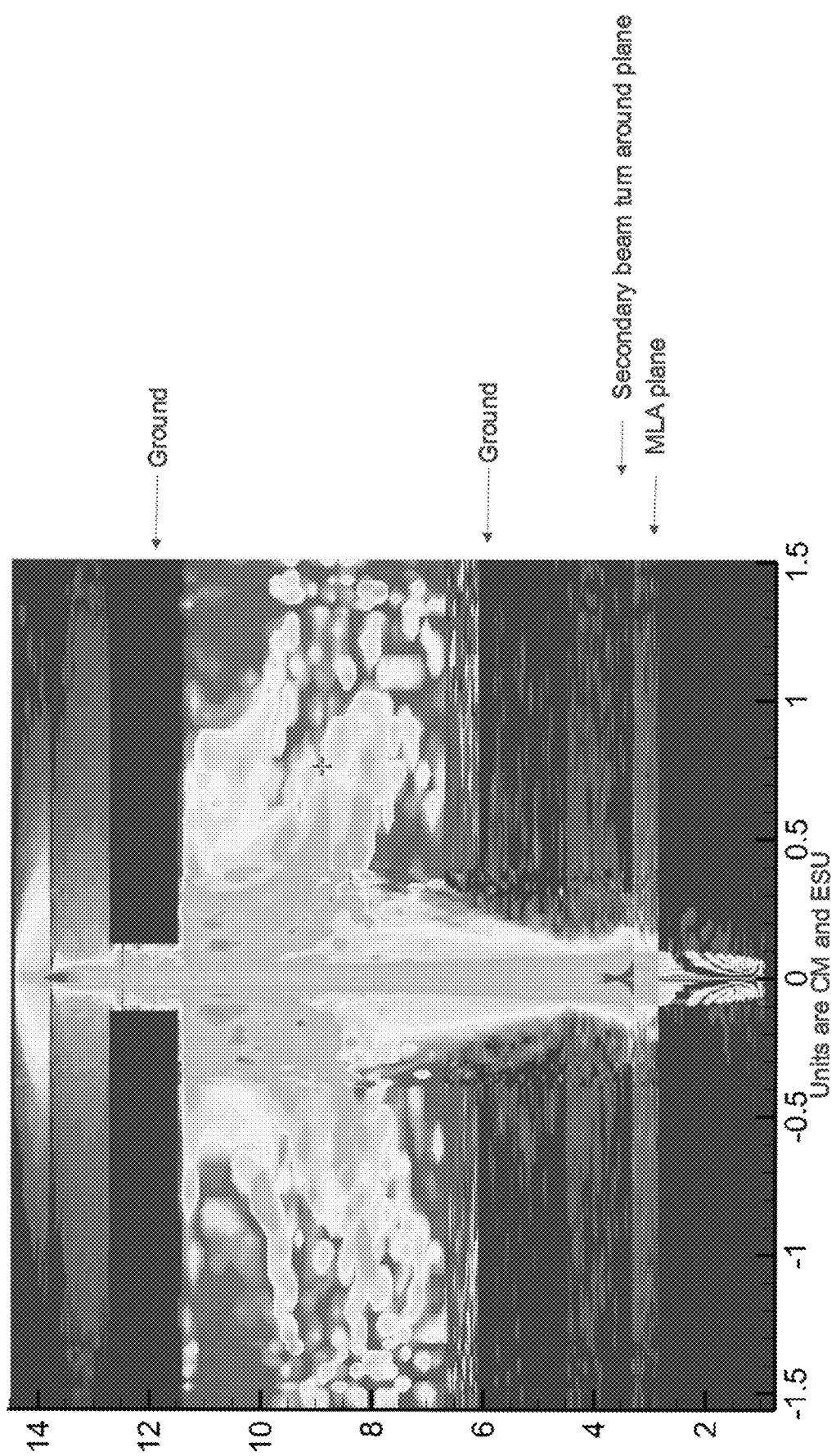
FIG. 12 shows space charge in a design with a field-free region and a cylindrical extractor.

FIG. 12 shows space charge in a design with a field-free region with a cylindrical extractor. The space charge accumulates in the field free region, where slow tertiary electrons dwell for long time. This can form random deflections at the image plane. In this case, the impact on brightness is about 500%.

Figure 13:
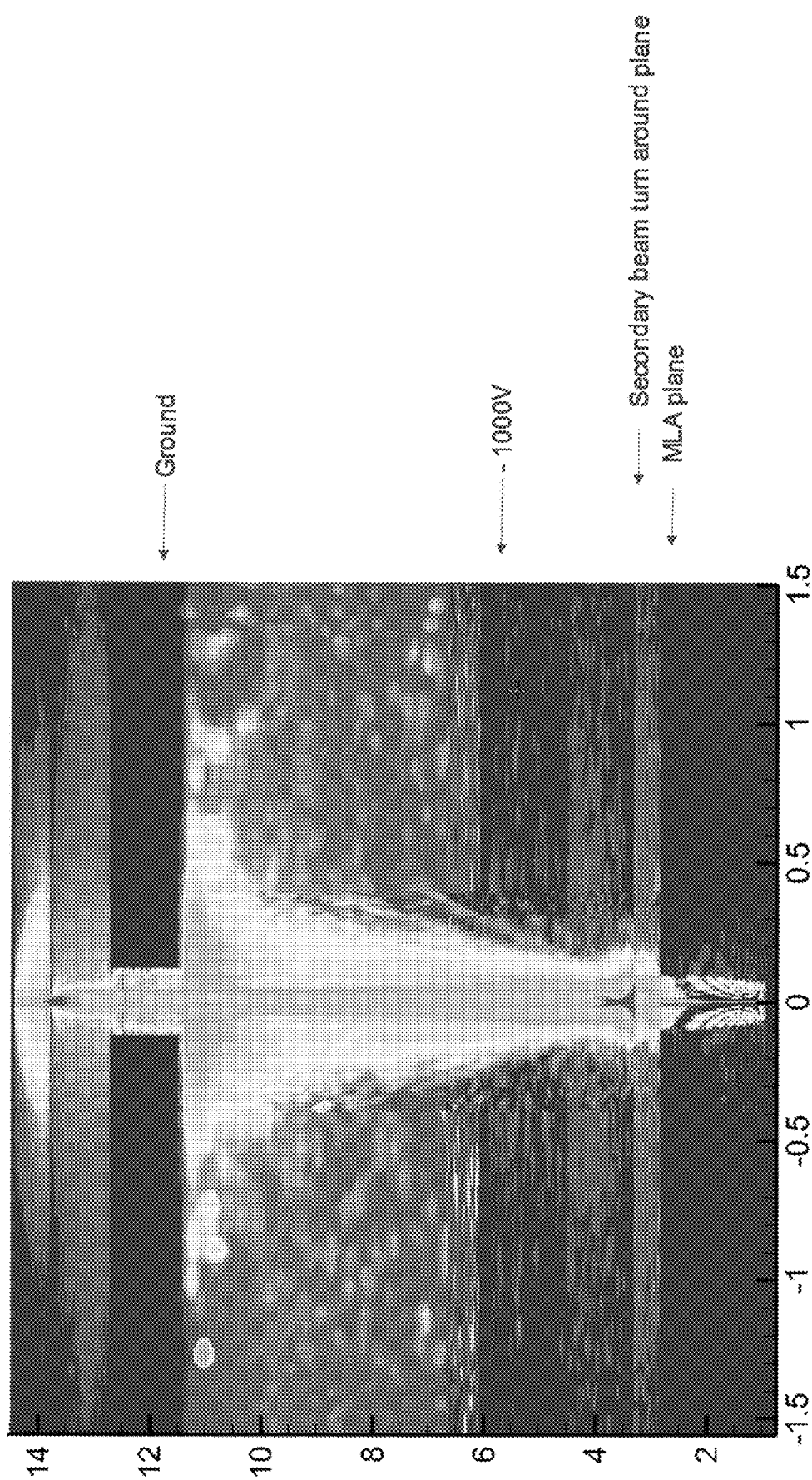
FIG. 13 shows space charge in a drift region with a negative field.

FIG. 13 shows space charge in a drift region with a negative field. By introducing an electrostatic field, tertiary electrons have much shorter transit time resulting in less space charge. In this case, the impact on brightness is about 30%. The field is pushing the tertiary and secondary electrons towards the beam limiting aperture. FIG. 13 uses the same units and scale as FIG. 12.

Figure 14:
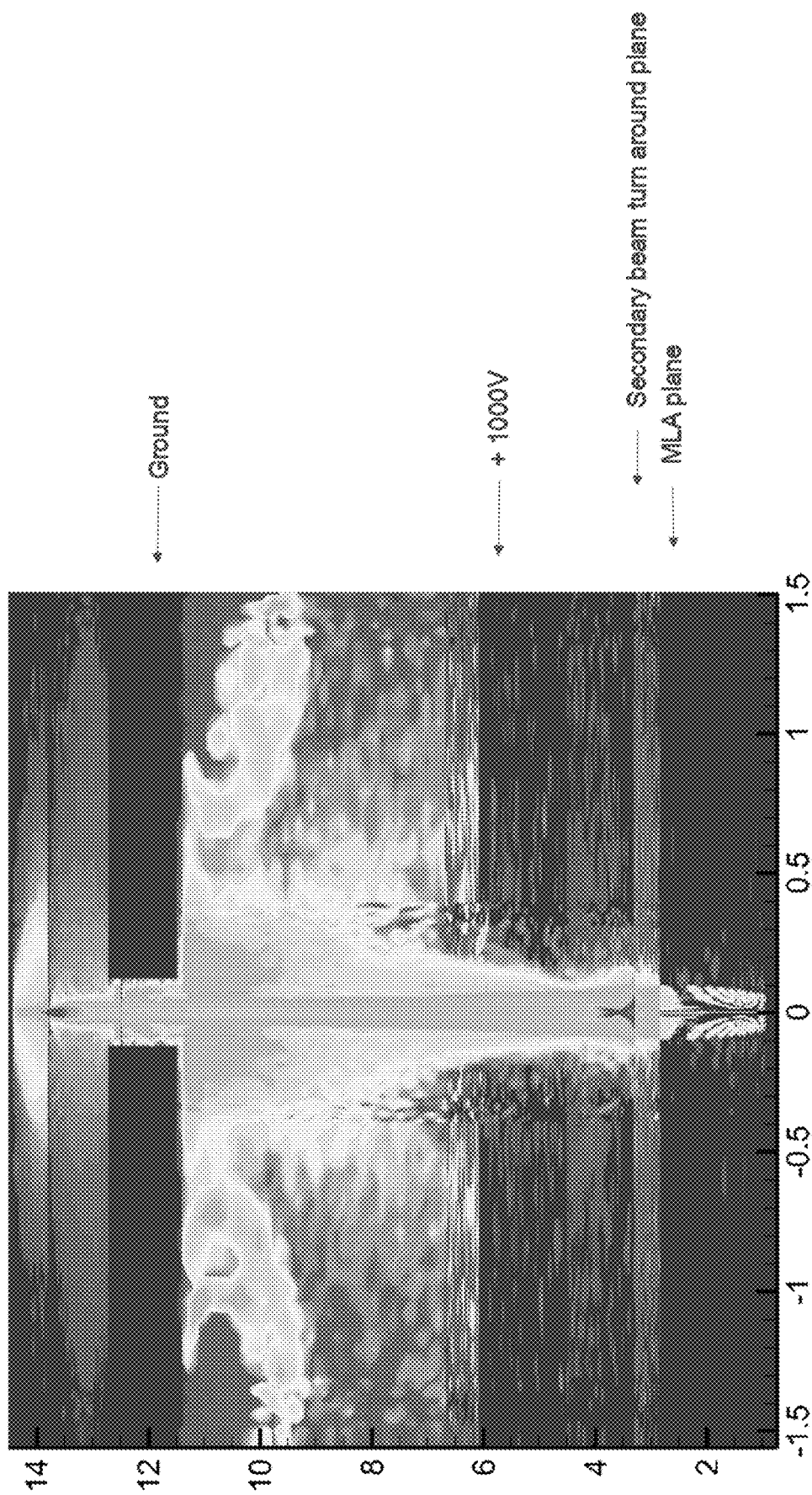
FIG. 14 shows space charge in a drift region with a positive field.

FIG. 14 shows space charge in a drift region with a positive field. By introducing an electrostatic field, tertiary electrons have much shorter transit time resulting in less space charge. In this case, the impact on brightness is about 15%. The field is pushing the tertiary and secondary electrons away from the beam limiting aperture. FIG. 14 uses the same units and scale as FIG. 12.

In FIGS. 9-14, the MLA refers to a micro lens array.

Figure 2:
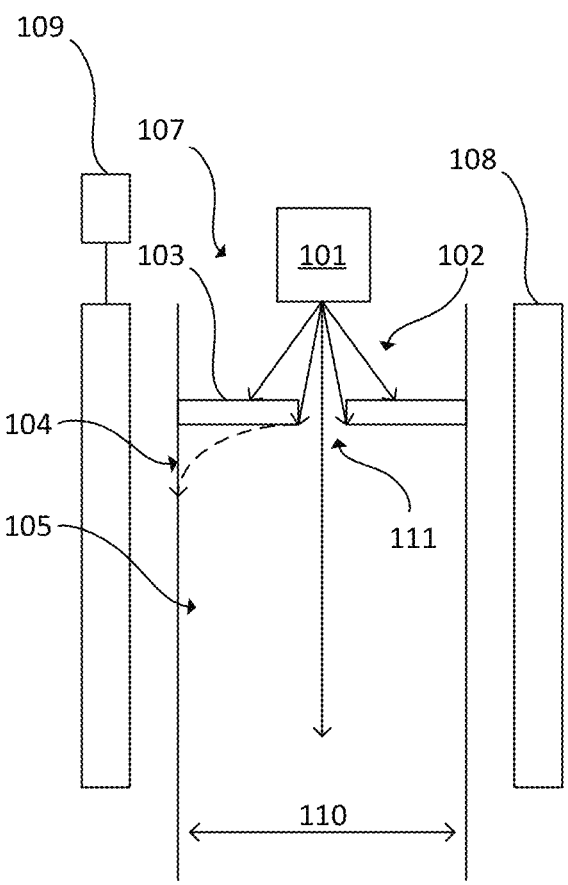
FIG. 2 is a block diagram that shows dimensioning of the beam drift region in accordance with the present disclosure.

The sweep electrode 301 illustrated in FIG. 5 can be combined with the inner width dimension 110 configuration of FIG. 2. The sweep electrode 301 also may be used instead of changing the inner width dimension 110 if vacuum requirements do not accommodate a particular inner width dimension 110 configuration.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:
1. An electron gun system comprising:
an electron source that directs a primary beam of electrons;

a plate defining a beam limiting aperture, wherein the primary beam of electrons is projected through the beam limiting aperture;

a magnetic field source that generates a magnetic field;

a voltage source connected to the magnetic field source;

a channel that the primary beam of electrons is projected through after being projected through the beam limiting aperture, wherein the channel has an inner width dimension perpendicular to a direction the primary beam of electrons is projected, wherein the inner width dimension is less than or equal to twice a value of a Larmor radius of secondary electrons in the channel, and wherein a Larmor time for the secondary electrons is greater than 1 ns; and a sweep electrode that generates an electric field in a drift region, wherein the sweep electrode is a biased plate that is disposed across the channel with an aperture that the primary beam of electrons passes through.

2. The electron gun system of claim 1, wherein the inner width dimension is a diameter.

3. The electron gun system of claim 1, wherein the inner width dimension is from 2 mm to 5 mm.

4. The electron gun system of claim 3, wherein the inner width dimension is from 2 mm to 3 mm.

5. The electron gun system of claim 1, wherein the electric field increases kinetic energy of secondary electrons in the channel and is configured to sweep the secondary electrons away from the primary beam thereby removing secondary electrons from the primary beam.

6. The electron gun system of claim 5, further comprising a second voltage source connected to the sweep electrode.

7. The electron gun system of claim 5, wherein the sweep electrode is positioned 6 mm downstream of the beam limiting aperture with respect to the direction the primary beam of electrons is projected.

8. The electron gun system of claim 5, wherein the sweep electrode operates at a voltage from −100 V to +100 V.

9. An electron gun system comprising:

an electron source that directs a primary beam of electrons;

a plate defining a beam limiting aperture, wherein the primary beam of electrons is projected through the beam limiting aperture;

a magnetic field source that generates a magnetic field;

a channel that the primary beam of electrons is projected through after being projected through the beam limiting aperture; and a sweep electrode that generates an electric field in a drift region, wherein the electric field increases kinetic energy of secondary electrons in the channel and is configured to sweep the secondary electrons away from the primary beam thereby removing secondary electrons from the primary beam, wherein the sweep electrode is a biased plate that is disposed across the channel with an aperture that the primary beam of electrons passes through.

10. The electron gun system of claim 9, further comprising a voltage source connected to the sweep electrode.

11. The electron gun system of claim 9, wherein the sweep electrode is positioned 6 mm downstream of the beam limiting aperture with respect to the direction the primary beam of electrons is projected.

12. The electron gun system of claim 9, wherein the sweep electrode operates at a voltage from −100 V to +100 V.

13. A method comprising:

generating a primary beam of electrons with an electron source;

projecting the primary beam of electrons through a beam limiting aperture;

projecting the primary beam of electrons through a channel downstream of the beam limiting aperture, wherein secondary electrons in the channel have a Larmor radius and a Larmor time, wherein the channel has an inner width dimension perpendicular to a direction the primary beam of electrons is projected, wherein the inner width dimension is less than or equal to twice a value of the Larmor radius, and wherein the Larmor time for the secondary electrons is greater than 1 ns; and limiting the secondary electrons in the channel to one orbit or less.

14. The method of claim 13, wherein the inner width dimension is a diameter.

15. The method of claim 13, wherein the inner width dimension is from 2 mm to 5 mm.

16. The method of claim 15, wherein the inner width dimension is from 2 mm to 3 mm.

* * * * *